US008953323B2

(12) United States Patent
Hwang (10) Patent No.: US 8,953,323 B2
(45) Date of Patent: Feb. 10, 2015

(54) DISPLAY DEVICE (71) Applicant: Samsung Display Co., Ltd., Yongin, Gyeonggi-do (KR)

(72) Inventor: Jung-Ho Hwang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 188 days.

(21) Appl. No.: 13/753,256

(22) Filed: Jan. 29, 2013

(65) Prior Publication Data

US 2013/0223013 A1 Aug. 29, 2013

(51) Int. Cl.
*H05K 7/00* (2006.01)
*H05K 7/20* (2006.01)
*H05K 7/14* (2006.01)

(52) U.S. Cl.
CPC .......... *H05K 7/20963* (2013.01); *H05K 7/1417* (2013.01)
USPC ........................................... 361/707; 361/752

(58) Field of Classification Search
USPC .................. 361/707, 752, 690, 695
See application file for complete search history.

(56) References Cited

U.S. PATENT DOCUMENTS 8,467,187 B2 * 6/2013 Itazawa et al. ................. 361/690
2012/0106122 A1 * 5/2012 Ryu et al. ........................ 362/19

FOREIGN PATENT DOCUMENTS

| KR | 10-2006-0014811 A | 2/2006 |
| KR | 10-2007-0038382 A | 4/2007 |
| KR | 10-2007-0090336 A | 9/2007 |
| KR | 10-2007-0093710 A | 9/2007 |

* cited by examiner

*Primary Examiner* — Andargie M Aychillhum
(74) *Attorney, Agent, or Firm* — Knobbe, Martens, Olson & Bear, LLP (57) ABSTRACT A display device is disclosed. In one embodiment, the device includes a display panel, a printed circuit board (PCB) disposed opposite to a rear of the display panel, and supplying a driving signal to the display panel, and a substrate bracket attached to an edge of the rear of the display panel, and supporting the PCB. The substrate bracket includes a bracket main body portion facing the PCB, a bracket coupling ledge bent and extending from a top of the bracket main body portion and enclosing a top of the PCB, and a bracket hook portion protruding from a bottom of the bracket main body portion in a direction toward the PCB, and supporting a bottom of the PCB.

10 Claims, 6 Drawing Sheets

FIG. 6

DISPLAY DEVICE

RELATED APPLICATIONS

This application claims priority to and the benefit of Korean Patent Application No. 10-2012-0020337 filed in the Korean Intellectual Property Office on Feb. 28, 2012, the entire contents of which are incorporated herein by reference.

BACKGROUND

1. Field

The described technology generally relates to a display device, and more particularly, to a display device that is simplified, and also has an effective heat dissipation structure.

2. Description of the Related Technology

Nowadays, there is a trend toward manufacturing low profile flat panel displays such as organic light emitting diode (OLED) displays and liquid crystal displays (LCDs).

As flat display panels are made progressively slimmer, methods are generally required for minimizing their overall thickness and for securely supporting the printed circuit boards (PCBs) that drive the display panels.

SUMMARY

One inventive aspect is a display device having the advantages of disposing a printed circuit board (PCB) securely on the rear of the display panel, while being simplified.

Another aspect is a display device capable of effectively dissipating heat generated by a PCB.

Another aspect is a display device, including: a display panel; a printed circuit board (PCB) disposed opposite to a rear of the display panel, and supplying a driving signal to the display panel; and a substrate bracket attached to an edge of the rear of the display panel, and supporting the PCB. The substrate bracket may include a bracket main body portion facing the PCB, a bracket coupling ledge bent and extending from a top of the bracket main body portion and enclosing a top of the PCB, and a bracket hook portion protruding from a bottom of the bracket main body portion in a direction toward the PCB, and supporting a lower part of the PCB.

The bracket coupling ledge of the substrate bracket may define a bypass space enabling the top of the PCB to be easily inserted.

The PCB may include a catching slot corresponding to the bracket hook portion of the substrate bracket.

The substrate bracket may be formed including one or more of a metal, ceramic, and resin having a thermal conductivity that is comparatively higher than the PCB and the display panel.

The display device may further include a double-sided adhesive member disposed between the display panel and the substrate bracket, and attaching the substrate bracket to the rear of the display panel.

The double-sided adhesive member may be made of a thermally conductive material.

The display device may further include a heat dissipating cushion attached to the PCB.

The display panel may include an organic light emitting element.

In the display device, one surface of the bracket main body portion opposite to the PCB may define a pattern of protrusions and depressions for heat dissipation.

In the display device, one surface of the bracket main body portion opposite to the display panel may define a pattern of protrusions and depressions for heat dissipation.

DETAILED DESCRIPTION

A PCB for driving a display panel is generally disposed at the side or rear of the display panel. As flat panel displays become slimmer, PCBs are also being down-sized and formed with high integration. However, it is still not easy to effectively dissipate the heat generated by the various circuit devices installed in relatively confined spaces. Furthermore, the heat generated by a PCB may adversely affect a partial region of a display panel that is proximate to the PCB.

Hereinafter, embodiments will be described more fully with reference to the accompanying drawings. As those skilled in the art would realize, the described embodiments may be modified in various ways, all without departing from the spirit or scope of the present disclosure.

It shall be noted that the drawings are schematic and do not depict exact dimensions. The relative proportions and ratios of elements in the drawings may be exaggerated or diminished in size for the sake of clarity and convenience in the drawings, and such arbitrary proportions are only illustrative and not limiting in any way. Like reference numerals are used for like structures, elements, or parts shown in two or more drawings to show similar characteristics. When one part is said to be "over" or "on" another part, the one part may be directly over the other part or may be accompanied by another part interposed therebetween.

The described embodiments are not limited to certain forms of the regions illustrated, but may include forms that are modified through manufacturing, for example.

Referring to FIG. 1 to FIG. 4, a display device 101 according to an embodiment will be described below.

Figure 1:
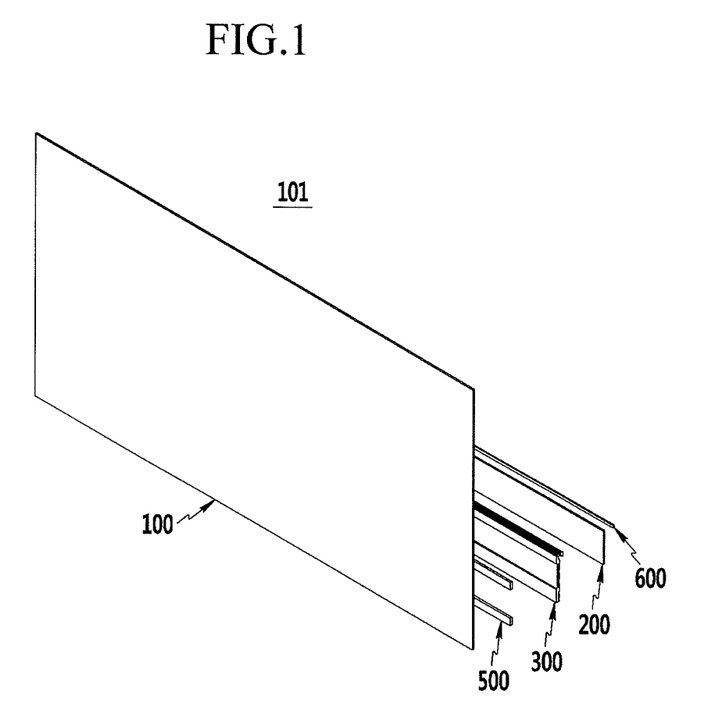
FIG. 1 is an exploded perspective view of a display device according to an embodiment.
Figure 2:
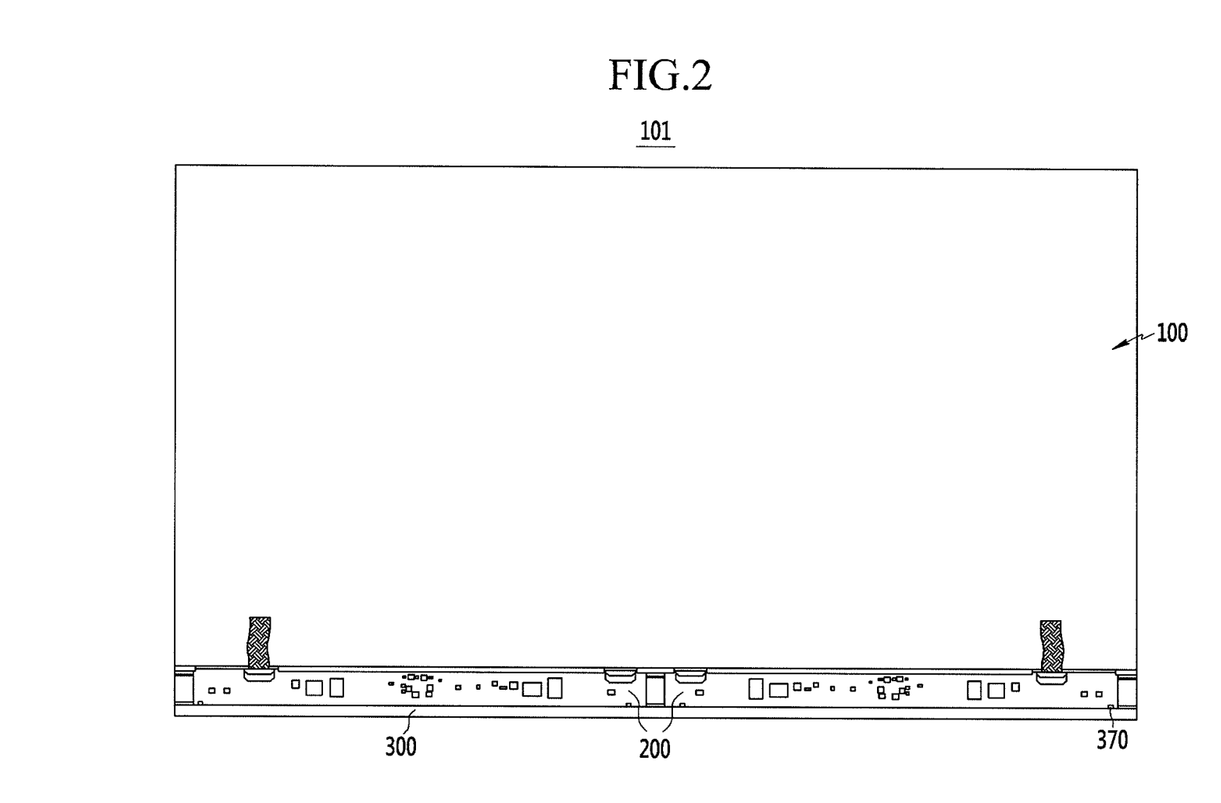
FIG. 2 is a rear view of the display device in FIG. 1.

As shown in FIG. 1 and FIG. 2, the display device 101 includes a display panel 100, a printed circuit board (PCB) 200, and a substrate bracket 300. The display device 101 may further include a double-sided adhesive member 500 and a heat dissipating cushion 600.

In one embodiment, the display panel 100 includes an organic light emitting element. The display device 101 may be an organic light emitting diode (OLED) display. The organic light emitting element may have various structures known by a person of ordinary skill in the art.

An OLED display typically is made comparatively slimmer than other flat display panels. Therefore, the display device 101 generally has a reduced overall thickness.

The PCB 200 is arranged opposite to the rear surface of the display panel 100. The PCB 200 is electrically connected to the display panel 100 to supply a driving signal to the display panel 100. That is, the display panel 100 displays an image according to a driving signal supplied by the PCB 200.

The substrate bracket 300 is attached to the rear surface edge of the display panel 100. The substrate bracket 300 also supports the PCB 200.

The substrate bracket 300 may be formed including one or more of a metal, ceramic, and resin that has a comparatively higher thermal conductivity than the PCB 200 and the display panel 100.

In one embodiment, the substrate bracket 300 performs the function of a support that supports and disposes the PCB 200 securely at the rear surface of the display panel 100, and also performs the function of a heat sink that dissipates heat generated by the PCB 200.

Figure 3:
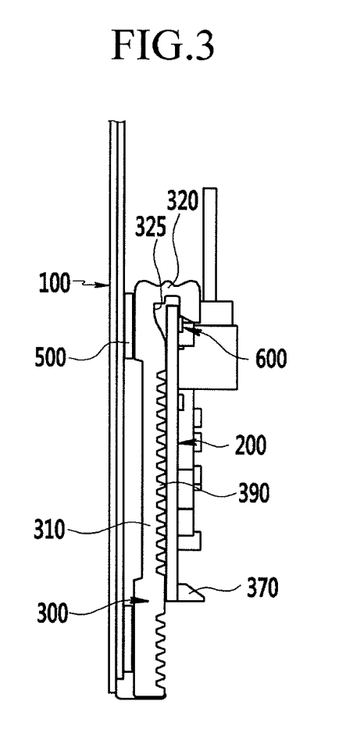
FIG. 3 is a partial side view of the display device in FIG. 1.

As shown in FIG. 3, the substrate bracket 300 includes a bracket main body portion 310, a bracket coupling ledge 320, and a bracket hook portion 370.

The bracket main body portion 310 faces the PCB 200. Specifically, the bracket main body portion 310 has one surface opposite to the PCB 200 and the other surface opposite to the display panel 100. The PCB 200 is also seated on the bracket main body portion 310.

The bracket main body portion 310 may have a pattern of protrusions and depressions 390 for heat dissipation formed on the surface thereof that is opposite to the PCB 200. The pattern 390 may effectively dissipate heat generated by the PCB 200 seated on the bracket main body portion 310.

The bracket main body portion 310 may also have a pattern of protrusions and depressions for heat dissipation formed on the other surface thereof opposite to the display panel 100. Further, the pattern 390 may be formed on both of the opposing surfaces of the bracket main body portion 310.

The bracket coupling ledge 320 is bent and extends from the top of the bracket main body portion 310 to enclose the top of the PCB 200. Further, the bracket coupling ledge 320 may have a bypass space 325 formed therein to enable the top of the PCB 200 to be easily inserted into the bracket coupling ledge 320. In addition, the PCB 200 may easily be separated from the substrate bracket 300 by virtue of the bypass space 325 defined by the bracket coupling ledge.

Figure 4:
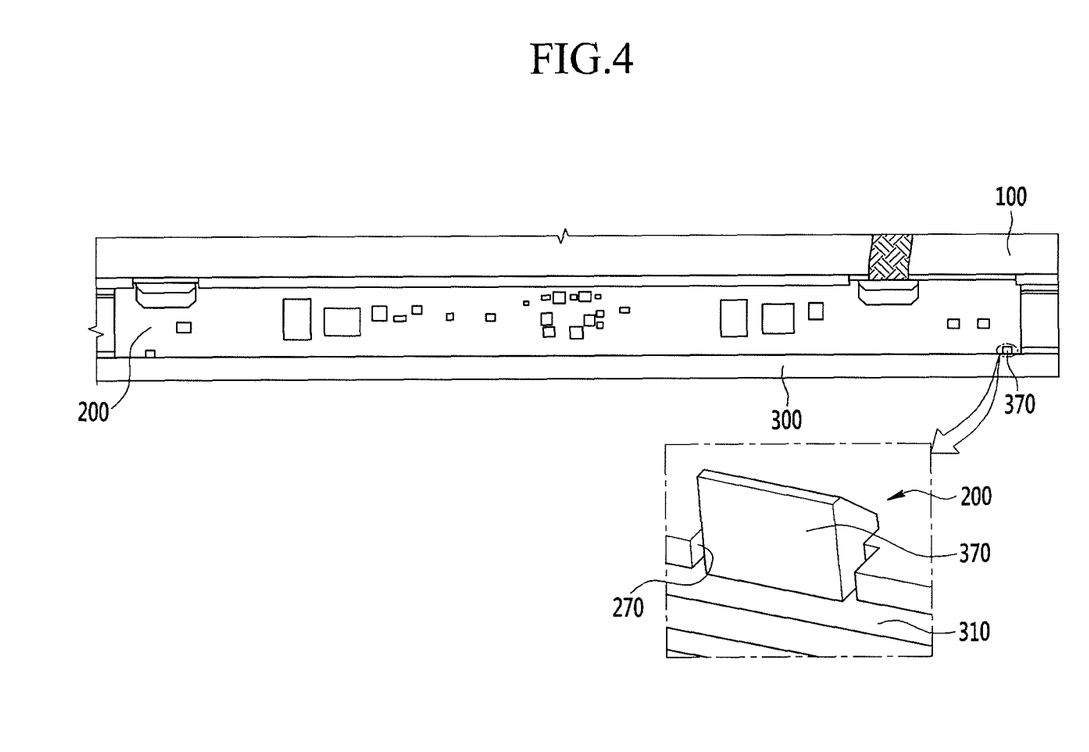
FIG. 4 is a partially enlarged view of FIG. 2.

The bracket hook portion 370 protrudes from the lower part of the bracket main body portion 310 in the direction toward the PCB 200 seated on the bracket main body portion 310 so as to support the lower part of the PCB 200. As shown in FIG. 4, the PCB 200 may include a catching slot 270 corresponding to the bracket hook portion 370. That is, the bracket hook portion 370 of the substrate bracket 300 is inserted in and coupled to the catching slot 270 of the PCB 200.

In this way, the top of the PCB 200 is inserted in the bracket coupling ledge 320, and the bottom of the PCB 200 is supported on the bracket hook portion 370, so that the PCB 200 is securely mounted by means of the substrate bracket 300.

The PCB 200 may be supported in a substantially vertical direction by the bracket coupling ledge 320 and the bracket hook portion 370, and may also be securely supported in a substantially lateral direction by the bracket hook portion 370 inserted in the catching slot 270 of the PCB 200.

In one embodiment, the double-sided adhesive member 500, as shown in FIG. 3, is disposed between the display panel 100 and the substrate bracket 300, and attaches the substrate bracket 300 to the rear of the display panel 100. Thus, the substrate bracket 300 may be simply and securely attached to the rear of the display panel 100.

In one embodiment, the double-sided adhesive member 500 is made of a thermally conductive material. Thus, even heat generated by the display panel 100 may be effectively dissipated by the substrate bracket 300 that functions as a heat sink.

The display device 101 may further include a heat dissipating cushion 600 attached to the PCB 200. The heat dissipating cushion 600 may be attached to a surface opposite the surface of the PCB 200 that faces the bracket main body portion 310 of the substrate bracket 300.

The heat dissipating cushion 600 aids in more effectively dissipating the heat generated by the PCB 200.

By means of such a structure, the display device 101 may be simplified and also securely dispose the PCB 200 on the rear of the display panel 100. That is, the PCB 200 may be securely disposed on the rear of the slimly formed display panel 100.

The display device 101 may also effectively dissipate the heat generated by the PCB 200. That is, heat generated by a large number of circuit devices installed in a relatively narrow space in a relatively highly integrated and down-sized PCB 200 can be effectively dissipated.

Figure 5:
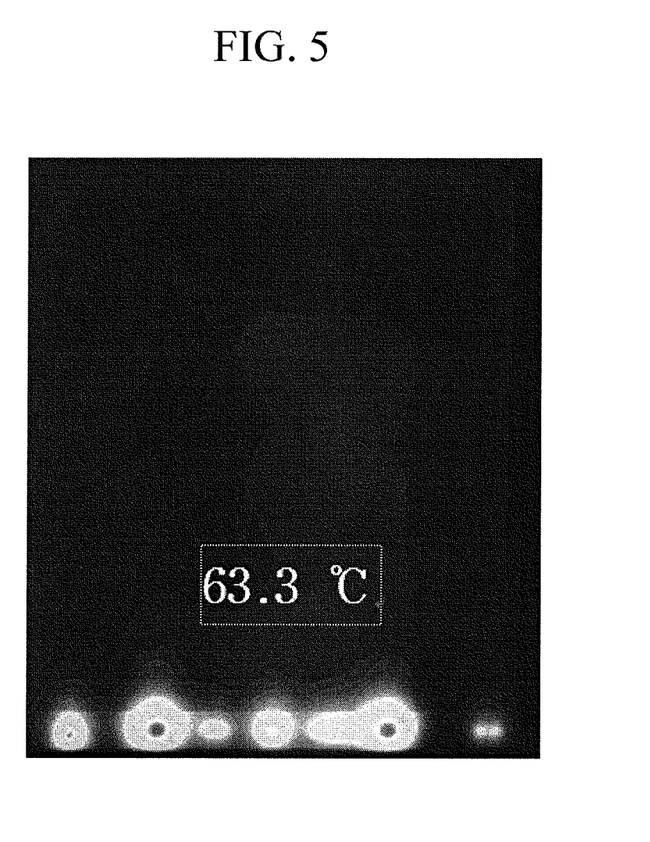
FIG. 5 and FIG. 6 are temperature distribution charts showing a Comparative Example and an Experimental Example.
Figure 6:
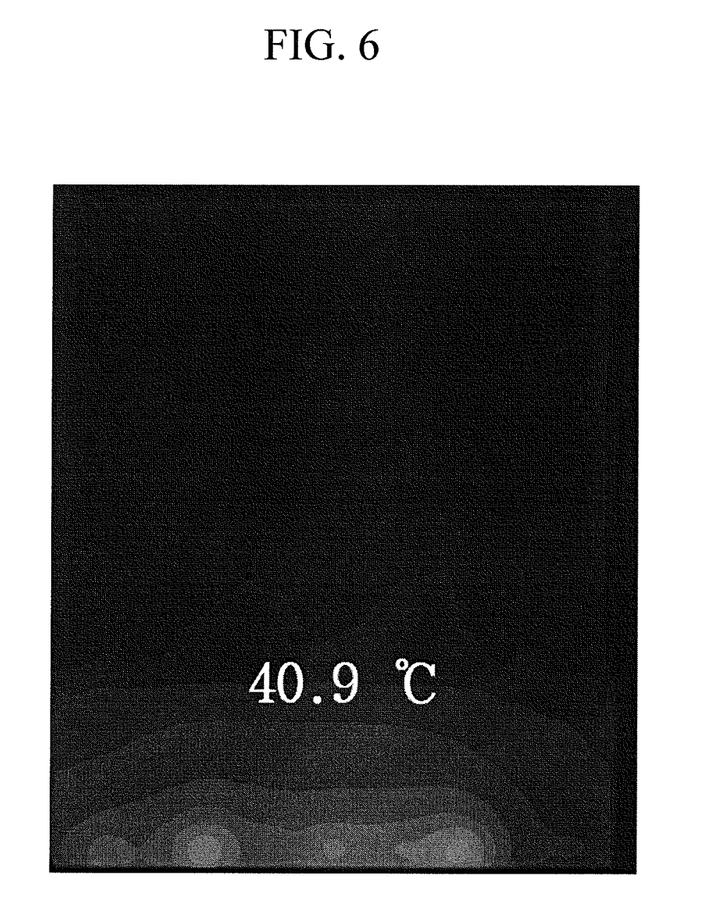

Referring to FIGS. 5 and 6, an Experimental Example and Comparative Example according to an embodiment will be addressed below.

FIG. 5 illustrates a PCB disposed at the rear of a display panel using a typical method, and the effects thereafter that dissipated heat from the PCB, which is generated by the operation of the display device, has on the display panel. As illustrated in FIG. 5, one region of a display panel near which a PCB is disposed has a high temperature, which is the reason for the deterioration in the quality of an image displayed on the display device.

Conversely, FIG. 6 illustrates a PCB disposed at the rear of a display panel by using a substrate bracket according to an embodiment, and the effects thereafter that dissipated heat from the PCB, which is generated by the operation of the display device, has on the display panel. As illustrated in FIG. 6, the effects that the heat generated by the PCB has on the display panel in the Experimental Example can be seen as slight when compared to the Comparative Example.

According to at least one of the disclosed embodiments, the display device disposes a PCB securely on the rear of the display panel, while being simplified. Further, the display device can effectively dissipate heat generated by a PCB.

While the above embodiments have been described in connection with the accompanying drawings, it is to be understood that the present disclosure is not limited to the disclosed embodiments, but, on the contrary, is intended to cover various modifications and equivalent arrangements included within the spirit and scope of the appended claims.

What is claimed is:

1. A display device, comprising:
   a display panel;
   a printed circuit board (PCB) configured to supply a driving signal to the display panel, wherein the PCB has a top and a bottom opposing each other, and wherein the bottom is closer to the display panel than the top; and
   a substrate bracket attached to an edge of a surface of the display panel, and supporting the PCB,
   wherein the substrate bracket comprises:
   a bracket main body portion facing the PCB, wherein the bracket main body portion has i) a top which contacts at least part of the bottom of the PCB and ii) a bottom which faces the display panel;
   a bracket coupling ledge bent and extending from the top of the bracket main body portion, wherein the bracket coupling ledge at least partially surrounds the top of the PCB; and
   a bracket hook portion protruding from the top of the bracket main body portion to pass through part of the PCB, and supporting the PCB.

2. The display device of claim 1, wherein the bracket coupling ledge defines a bypass space into which at least a portion of the top of the PCB is inserted.

3. The display device of claim 1, wherein the PCB comprises a catching slot corresponding to the bracket hook portion of the substrate bracket.

4. The display device of claim 1, wherein the substrate bracket is formed of at least one of the following: a metal, ceramic, and resin having a thermal conductivity that is comparatively higher than the PCB and the display panel.

5. The display device of claim 1, further comprising a double-sided adhesive member disposed between the display panel and the substrate bracket, and attaching the substrate bracket to the surface of the display panel.

6. The display device of claim 5, wherein the double-sided adhesive member is formed of a thermally conductive material.

7. The display device of claim 1, further comprising a heat dissipating cushion attached to the PCB.

8. The display device of claim 1, wherein the display panel comprises an organic light emitting element.

9. The display device of claim 1, wherein a plurality of protrusions and depressions for heat dissipation are formed in at least part of the top of the main body portion.

10. The display device of claim 1, wherein a plurality of protrusions and depressions for heat dissipation are formed in at least part of the bottom of the main body portion.

* * * * *

UNITED STATES PATENT AND TRADEMARK OFFICE
CERTIFICATE OF CORRECTION

PATENT NO. : 8,953,323 B2  
APPLICATION NO. : 13/753256  
DATED : February 10, 2015  
INVENTOR(S) : Jung-Ho Hwang

Page 1 of 1

It is certified that error appears in the above-identified patent and that said Letters Patent is hereby corrected as shown below:

ON THE TITLE PAGE

Column 1 (page 1) Below "Prior Publication Data, US 2013/0223013 A1   Aug. 29, 2013," insert Item (30) --Foreign Application Priority Data, Feb. 28, 2012 (KR)................ 10-2012-0020337--.

Signed and Sealed this  
Twenty-seventh Day of October, 2015

Michelle K. Lee  
*Director of the United States Patent and Trademark Office*